United States Patent
Chinthakindi et al.

(10) Patent No.: US 7,682,922 B2
(45) Date of Patent: Mar. 23, 2010

(54) POST STI TRENCH CAPACITOR

(75) Inventors: Anil K. Chinthakindi, Hay Market, VA (US); Deok-Kee Kim, Bedford Hills, NY (US); Xi Li, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 11/624,385

(22) Filed: Jan. 18, 2007

(65) Prior Publication Data

US 2008/0173977 A1 Jul. 24, 2008

(51) Int. Cl.
H01L 21/20 (2006.01)

(52) U.S. Cl. ............... 438/386; 438/389; 438/391; 438/392

(58) Field of Classification Search .......... 438/386, 438/389, 391, 392
See application file for complete search history.

(56) References Cited

U.S. PATENT DOCUMENTS

| | | | |
|---|---|---|---|
| 6,096,580 | A | 8/2000 | Iyer et al. |
| 6,141,245 | A | 10/2000 | Bertin et al. |
| 6,323,535 | B1 | 11/2001 | Iyer et al. |
| 6,331,459 | B1 | 12/2001 | Gruening |
| 6,346,846 | B1 | 2/2002 | Bertin et al. |
| 6,388,305 | B1 | 5/2002 | Bertin et al. |
| 6,396,120 | B1 | 5/2002 | Bertin et al. |
| 6,396,121 | B1 | 5/2002 | Bertin et al. |
| 6,433,404 | B1 | 8/2002 | Iyer et al. |
| 6,465,370 | B1 * | 10/2002 | Schrems et al. ............ 438/783 |
| 6,498,056 | B1 | 12/2002 | Motsiff et al. |
| 6,570,207 | B2 | 5/2003 | Hsu et al. |
| 6,577,156 | B2 | 6/2003 | Anand et al. |
| 6,621,324 | B2 | 9/2003 | Fifield et al. |
| 6,624,031 | B2 | 9/2003 | Abadeer et al. |
| 6,624,499 | B2 | 9/2003 | Kothandaraman et al. |
| 6,633,055 | B2 | 10/2003 | Bertin et al. |
| 6,753,590 | B2 | 6/2004 | Fifield et al. |
| 6,787,838 | B1 | 9/2004 | Chidambarrao et al. |
| 6,794,726 | B2 | 9/2004 | Radens et al. |
| 6,830,968 | B1 | 12/2004 | Kim et al. |
| 6,879,021 | B1 | 4/2005 | Fitfield et al. |
| 6,882,027 | B2 | 4/2005 | Brintzinger et al. |
| 6,972,614 | B2 | 12/2005 | Anderson, II et al. |
| 2005/0064710 | A1 | 3/2005 | Chidambarrao et al. |
| 2007/0054461 | A1 * | 3/2007 | Su ........................... 438/386 |

FOREIGN PATENT DOCUMENTS

| | | |
|---|---|---|
| CN | 1542943 A | 11/2004 |
| TW | 0270179 B | 1/2007 |

* cited by examiner

*Primary Examiner*—Long Pham
(74) *Attorney, Agent, or Firm*—Whitham, Curtis, Christofferson & Cook, P.C.; Joseph P. Abate

(57) ABSTRACT

A capacitor having a suitably large value for decoupling applications is formed in a trench defined by isolation structures such as recessed isolation or shallow trench isolation. The capacitor provides a contact area coextensive with an active area and can be reliably formed individually or in small numbers. Plate contacts are preferably made through implanted regions extending to or between dopant diffused regions forming a capacitor plate. The capacitor can be formed by a process subsequent to formation of isolation structures such that preferred soft mask processes can be used to form the isolation structures and process commonality and compatibility constraint are avoided while the capacitor forming processes can be performed in common with processing for other structures.

9 Claims, 17 Drawing Sheets

POST STI TRENCH CAPACITOR

BACKGROUND OF THE INVENTION

1. Field of the Invention

The present invention generally relates to methods of fabricating trench capacitors and, more particularly, to trench capacitor fabrication which is free of requirements for process commonality and thus applicable to decoupling functions, particularly for application specific integrated circuits (ASICs).

2. Description of the Prior Art

Use of capacitors in integrated circuits has led to the design of many different configurations of the plates and dielectric thereof in an effort to better match the electrical and mechanical characteristics to the requirements imposed by the overall integrated circuit design. In particular, compared to large arrays of small capacitors in memories, decoupling applications to prevent variations in voltage caused by current load at one part of a circuit such as an integrated circuit from propagating to another part of the circuit require capacitors of relatively large size and capacitance value in relatively small numbers, often individually in specific locations on a chip which is generally densely integrated with other types of structures.

It is recognized in semiconductor manufacture that the formation of many types of structures may be affected by local conditions at the reaction interface. For this reason, it has often been the practice for reliably forming structures in small numbers, to form additional or "dummy" structures surrounding or interspersed with the structures of interest. Formation of such additional structures beyond those required not only improves reliability of formation of the intended structures but may also provide a degree of redundancy for substitution for and structures having marginal properties. However, doing so for larger structures to meet minimum pattern density constraints consumes correspondingly more chip space.

Additionally, process cost and compatibility are unavoidable concerns in integrated circuit manufacture and often require trade-offs or impose constraints on technologies which can be utilized as well as device complexity such as collars, multiple polysilicon fill deposits for deep trench capacitors and complexity of contact formation. For example, MOS transistors are often the technology of choice for application specific integrated circuits (ASICs) but have required MOS capacitors for decoupling even though MOS capacitors exhibit significant leakage while development of large capacitances is difficult and consumes large chip space. Further, known methods of fabricating decoupling capacitors has required formation of the capacitors prior to defining the active area(s) of the chip, generally with recessed isolation or shallow trench isolation (STI) formation requiring a hard mask and is thus incompatible with the soft mask process of choice.

SUMMARY OF THE INVENTION

It is therefore an object of the present invention to provide a trench capacitor which can be formed without constraints on dimensions and substantially free of minimum pattern density constraints, having a geometry to which connections may readily be made and having substantially complete process compatibility and imposing little, if any, additional process cost.

It is another object of the invention to provide a decoupling capacitor structure suitable for integrated circuits and (ASICs in particular) of simplified structure and simplified process flow.

In order to accomplish these and other objects of the invention, a method of fabricating an integrated circuit including a decoupling capacitor is provided comprising steps of defining active areas of a chip, opening a mask at a location corresponding to at least one active area, forming a trench at the one active area, forming a plate, capacitor dielectric and node in said trench, and forming connections to the plate and the node.

In accordance with another aspect of the invention, a trench capacitor is provided comprising a trench formed in an active area between isolation regions, a contact region coextensive with an active area between isolation structures, a plate structure comprising a diffused dopant in walls of the trench, a dielectric layer within said trench, and a semiconductor material filling the trench within the dielectric layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
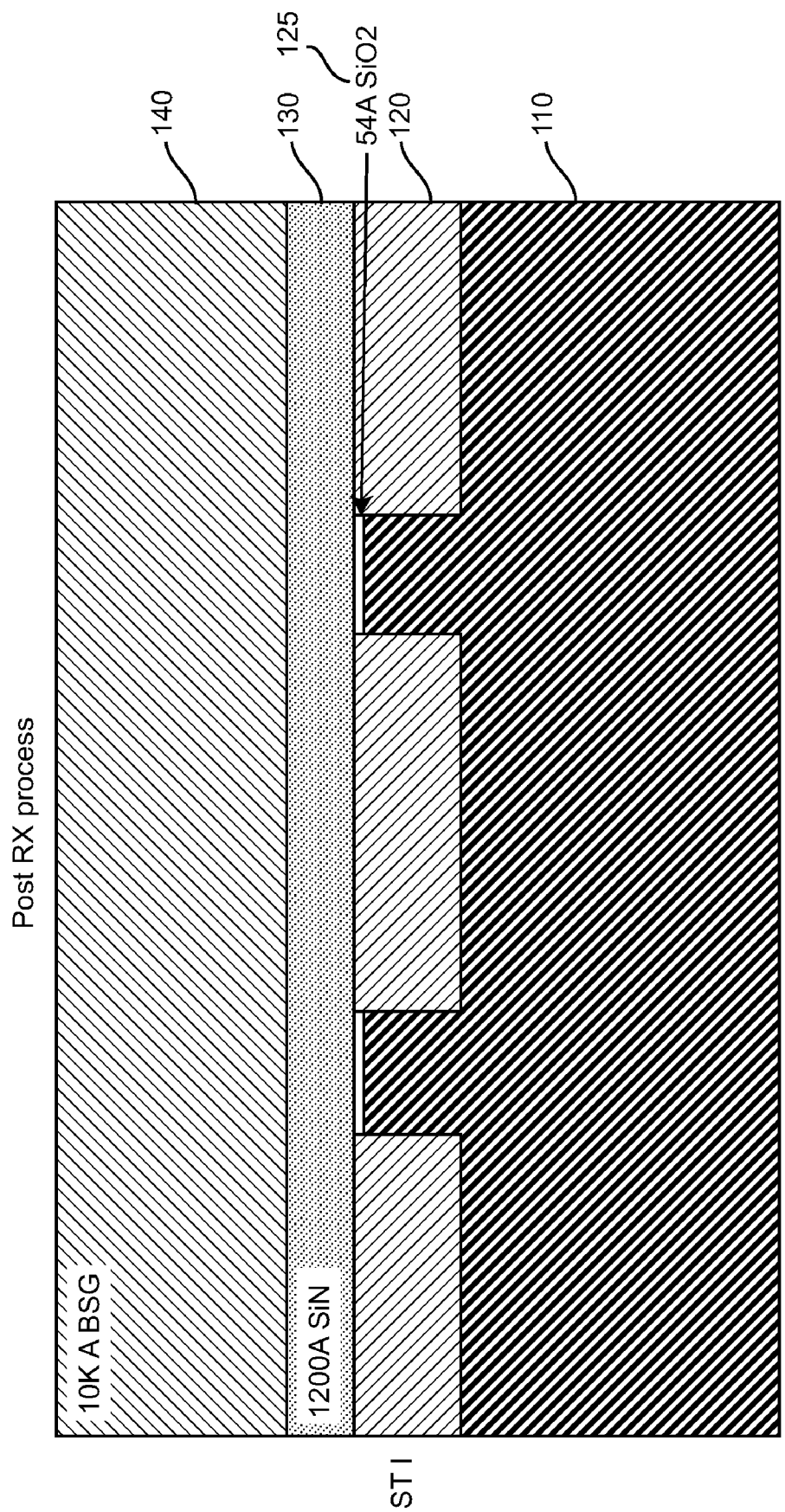
FIGS. 1, 2, 3, 4, 5, 6, 7, 8, 9, 10, 11, 12, 13, 14, 15 and 16 are cross-sectional views illustrating stages of fabrication of a preferred embodiment of the invention.

Referring now to the drawings, and more particularly to FIG. 1, there is shown, in cross-section, an initial stage in the formation of a trench capacitor in accordance with the invention. It should be appreciated during the following discussion that a major meritorious effect of the invention is process compatibility with earlier stages of manufacture of an integrated circuit of essentially arbitrary design.

Thus FIG. 1 corresponds to a substrate wherein the preceding stages of processing have defined the active area(s) of the chip with recessed isolation or shallow trench isolation (STI) structures (the distinction between which is not important to an understanding of the invention) such that a low cost and rapidly and reliably formed soft mask can be used for forming the isolation structures, as is preferred, and avoids any requirement for process commonality although numerous and possibly all processes in the formation of capacitors in accordance with the invention can be performed in common with processes for the formation of other structures to limit cost.

It should be noted that other process steps illustrated in FIGS. 2-15 involve processes which are likely to be found in processes for forming other structures and which are generally inexpensive. Therefore, it is projected that the excess cost attributable to the invention will be no more than about 6% for any type of integrated circuit and may not present any additional cost at all if logic circuit fabrication is properly planned.

It is also to be noted that the capacitors of the invention are a simplified structure which is somewhat similar to known deep trench capacitor structures in some respects but with no particular depth requirement and which can be formed without collar structures and a single polysilicon fill deposition process and which provide for contacts and wiring to be readily formed, even at the so-called first metal or M1 level of the integrated circuit. The contacts can be formed having the same footprint as the trench itself while not requiring features of the capacitor to consume additional chip space to obtain such a contact area for low resistance. The capacitors in accordance with the invention do not have any requirement for the use of the same grounds rules and critical dimensions of any other structure to be formed on the chip since no collar or other complex structure need be formed while the capacitor can be formed with standard spacing of other elements on the chip such as eDRAM spacing between deep trenches.

FIG. 1 shows a portion of a chip or wafer 110 after defining active areas by the formation of STI structures 120. A pad oxide 125 is usually grown on the active areas prior to pad nitride deposition for better adhesion between the pad nitride and the silicon substrate. The surface of the chip is covered with a blanket layer of pad nitride 130, preferably of about 1200 Å thickness. This pad nitride is covered with a thick (e.g. about 10K Å of borosilicate glass (BSG) which will serve as a hard mask. Other materials such as TERA composed of silicon, carbon, oxygen and nitrogen as disclosed in U.S. Published Patent application 2005/0,255,386 A1 which is hereby fully incorporated by reference can also be used. It should be noted that the BSG 140 is used to form a hard mask in the pad nitride 130 which remains in place through completion of the capacitor in accordance with the invention but for contact and wiring formation (e.g. through FIG. 15) and thus commonality of processes in forming the capacitor and other structures can be readily exploited such as by forming and/or masking additional openings in the pad nitride 130 at appropriate points.

Figure 2:
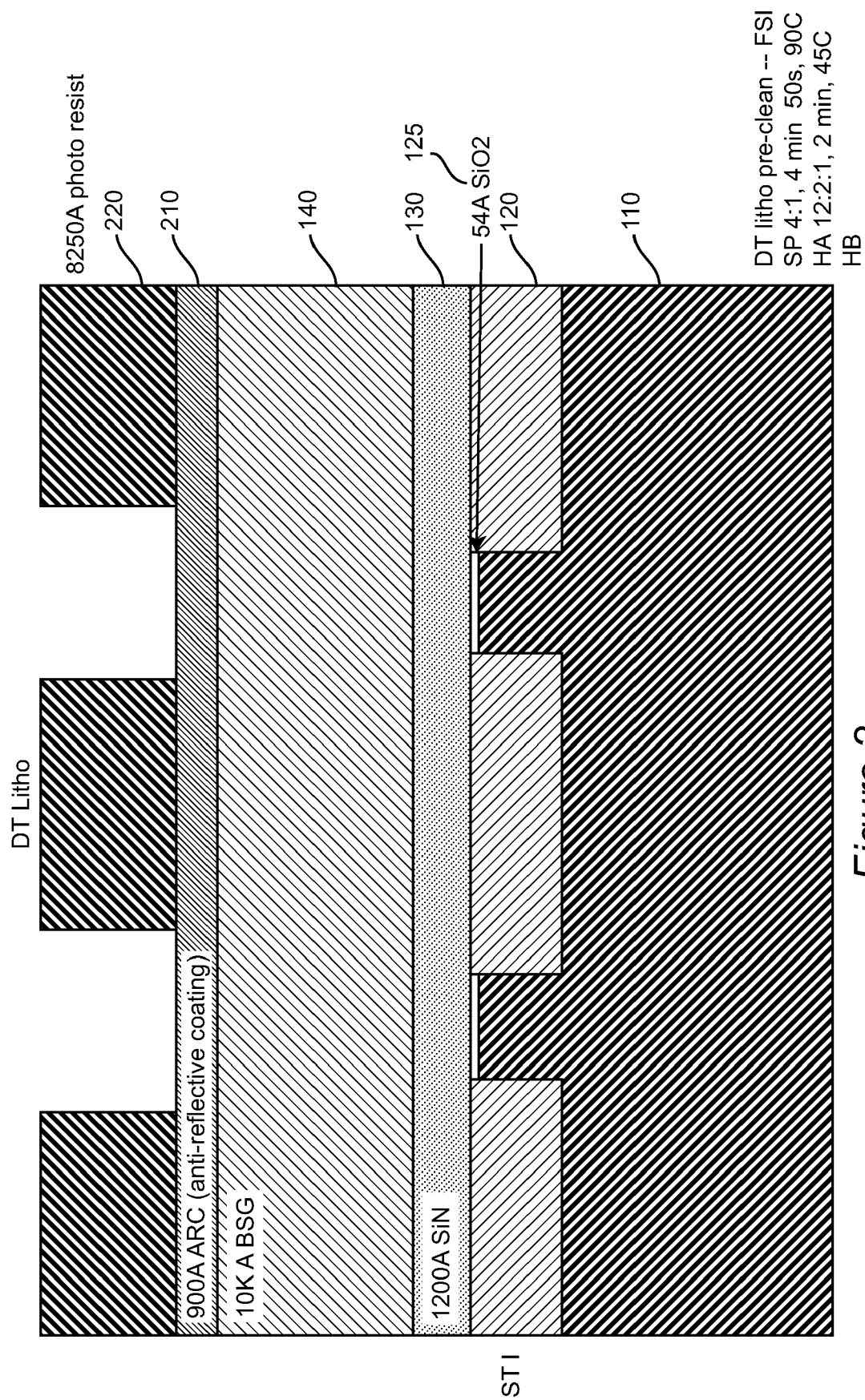
Figure 3:
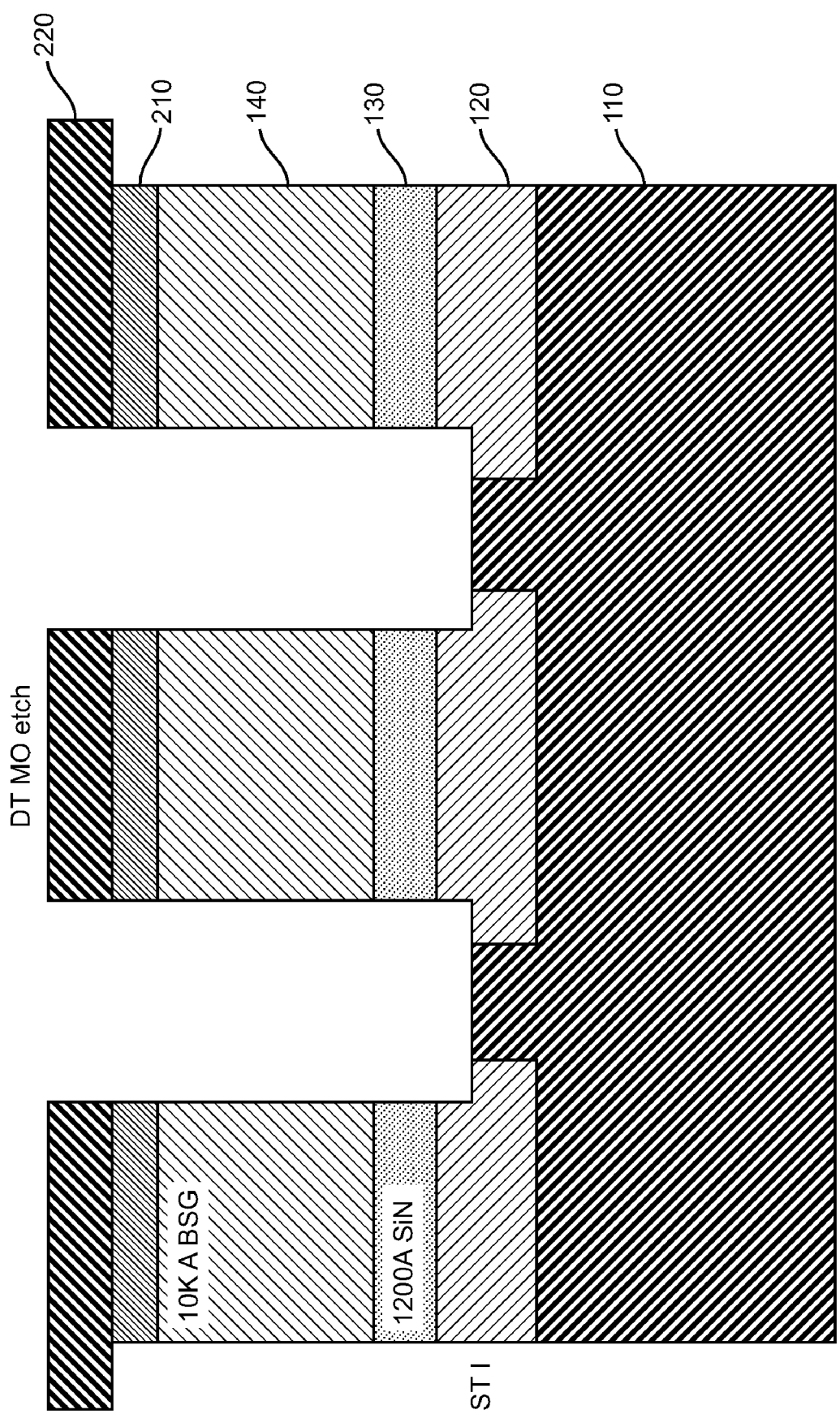
Figure 4:
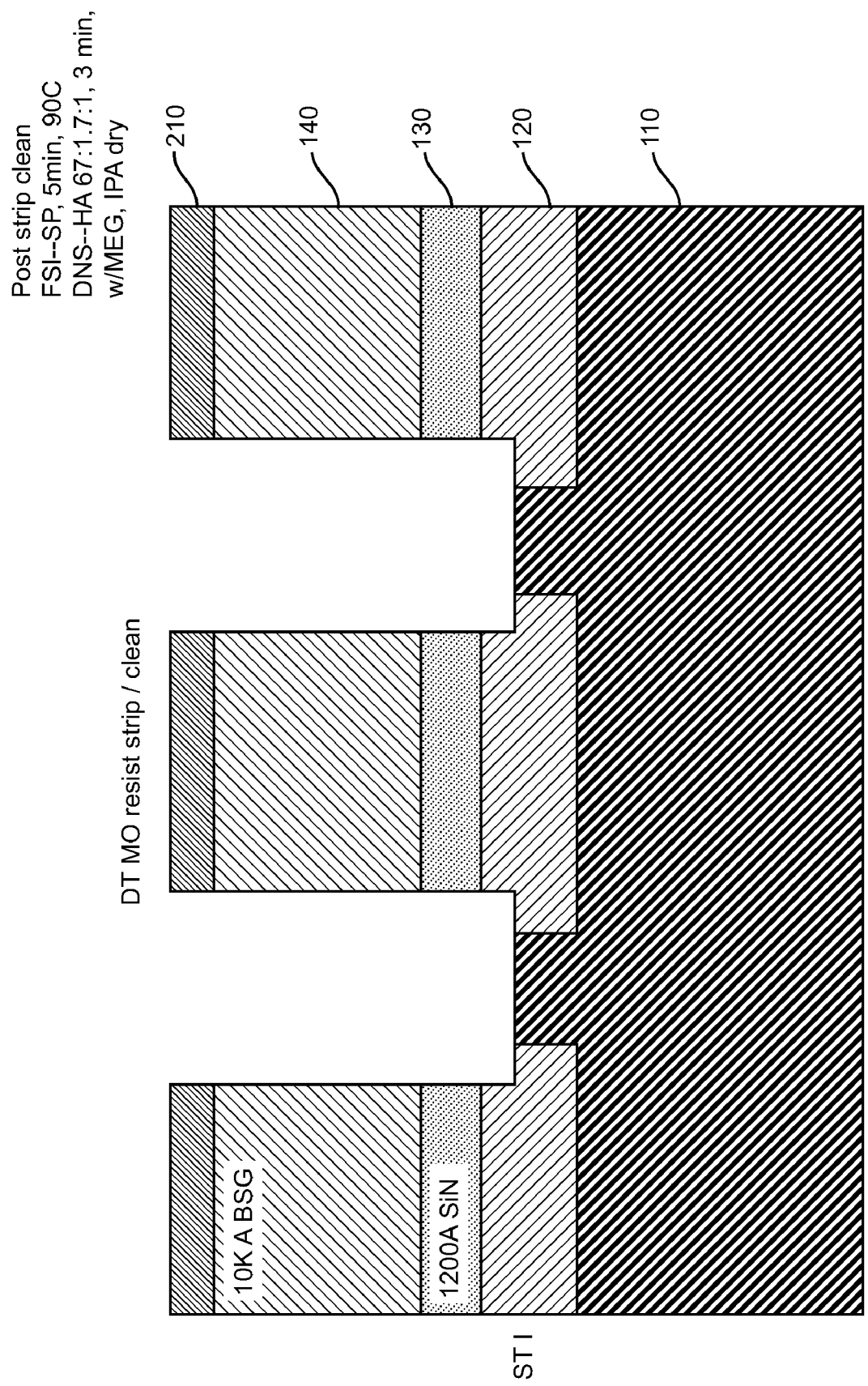

Then, as shown in FIG. 2, the process of forming capacitors in accordance with the invention is continued by optionally but preferably applying a thin (e.g. 900 Å) layer of anti-reflective coating (ARC) 210 and a photoresist layer 220 which is then patterned to form openings preferably slightly larger than the spacing between STI structures using any known lithographic process suitable to the resist (or vice-versa). Then, as shown in FIG. 3, a hard mask is formed in the BSG layer 140 and nitride layer 130 through layer 210 and which preferably reaches slightly into the chip or wafer 110 (removing oxide 125, if present) and the STI structures 120 to form mask openings 310. Following this etch (which is preferably performed using several different selective etches with different etchants), the resist 220 is stripped and the resulting structure cleaned for further processing as shown in FIG. 4.

Figure 5:
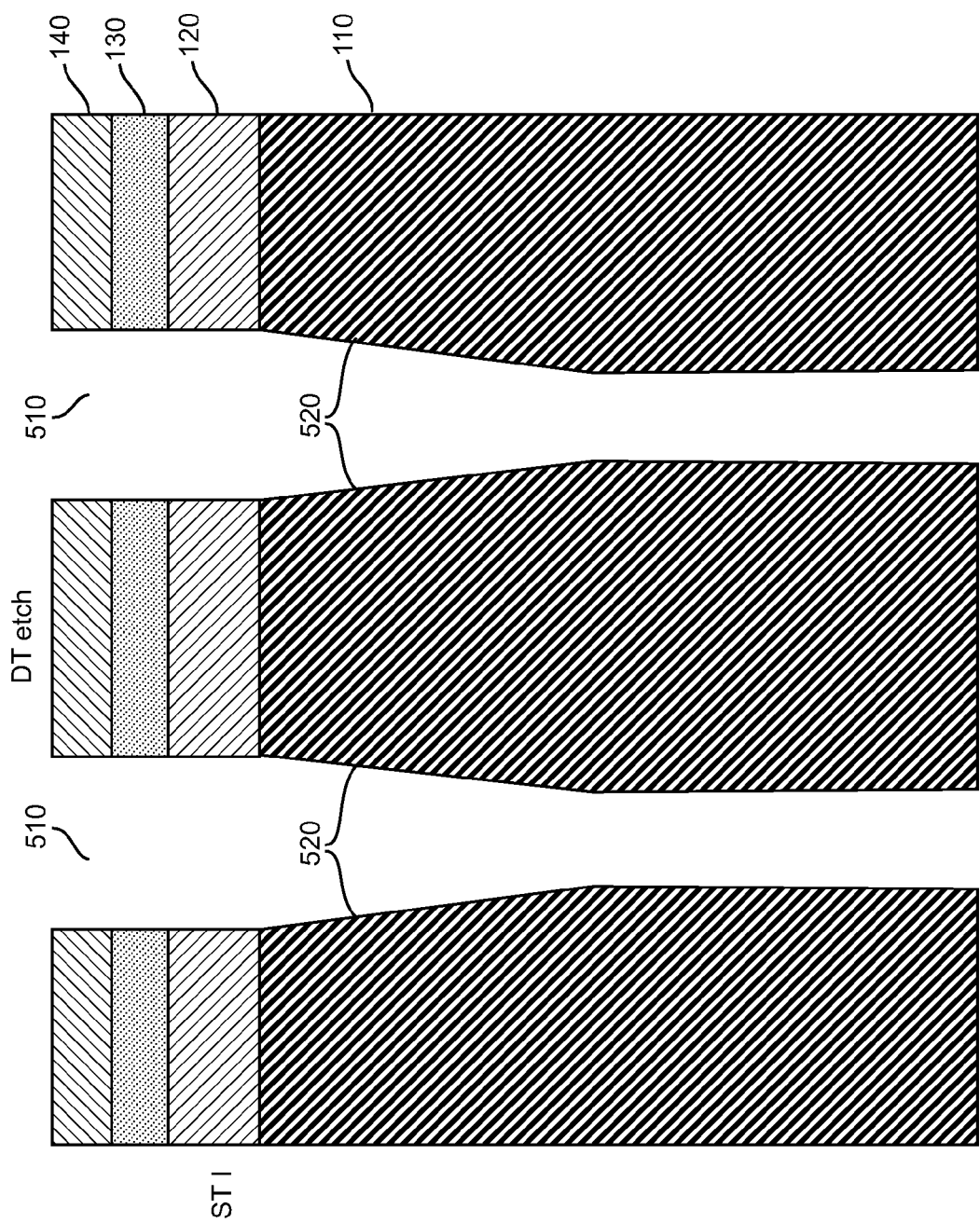
Figures 17A, 17B:
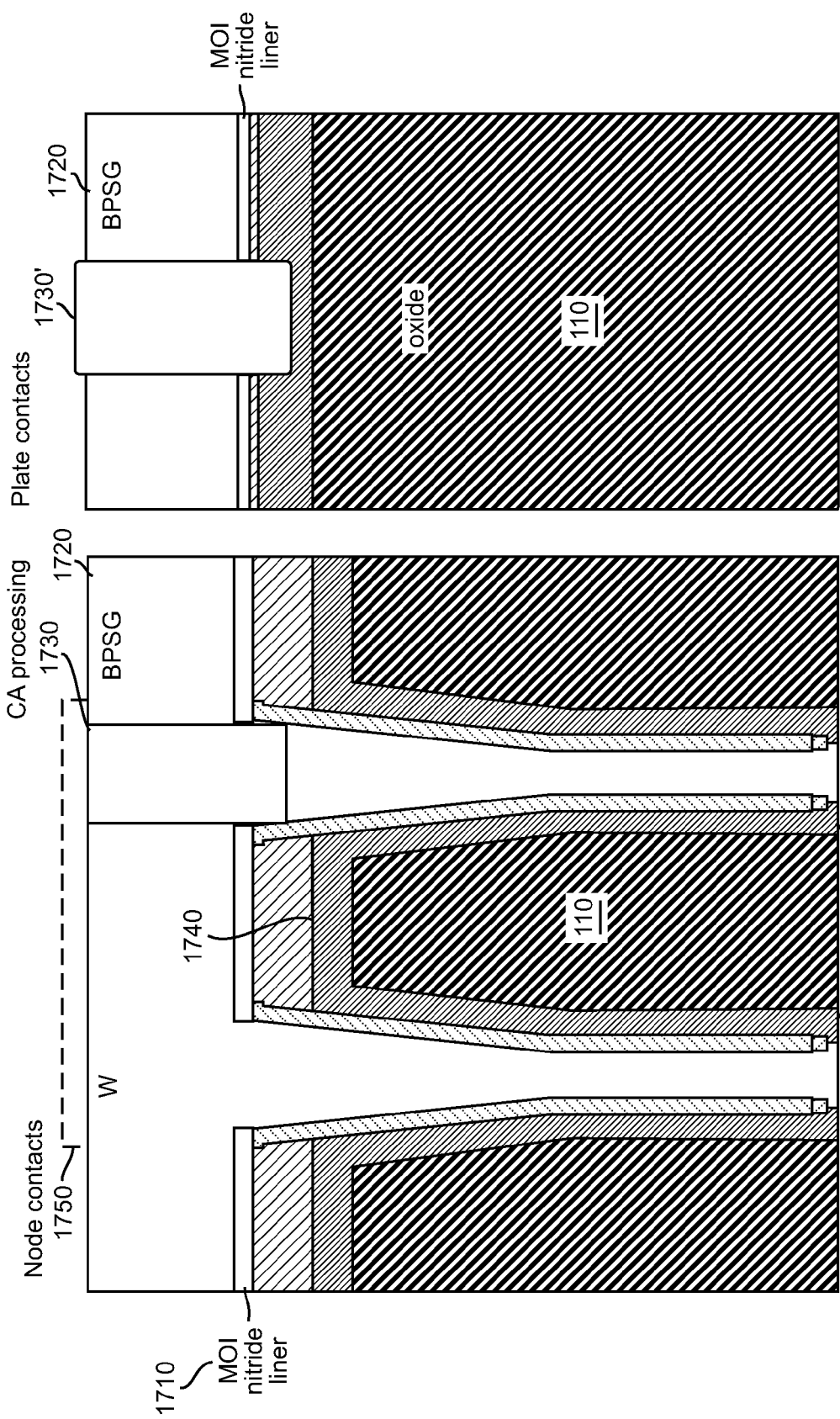
FIGS. 17A and 17B are cross-sectional views illustrating contact formation and parallel connection of capacitors to develop increased capacitance values.

As illustrated in FIG. 5, trenches 510 are formed by using an anisotropic etch using hard mask 130/140. The depth of the trench is non-critical to the basic principles of the invention and should be chosen in view of the capacitance required. A depth of about 6.5 μm is preferred with the transverse dimension of the opening and trench designed to provide the desired capacitance value. Also, several trench capacitors in accordance with the invention can be connected in parallel if necessary as can be achieved by a simple Arsenic implant process in selected areas as illustrated in FIG. 17A) to obtain a desired large capacitance value consistent with other required geometry. In general, the expected capacitance available from the trench capacitor structure in accordance with the invention is projected to be about 190 fF/μm², regardless of how capacitors are configured.

It should be noted that a wider dimension of the hard mask openings is generally preferred to enhance the etching process as the trenches are etched more deeply into substrate 110 since so-called anisotropic etches are not ideally so as indicated by the shallow and largely self-limiting taper of the trenches illustrated at 520. Larger openings also facilitate contact and wiring formation and it may be desirable to perform the trench etching process such that a desired degree of tapering results, particularly such that the area of the top of the trench and which will be available for contacts and wiring will be coextensive with an entire active area between isolation structures.

Figure 6:
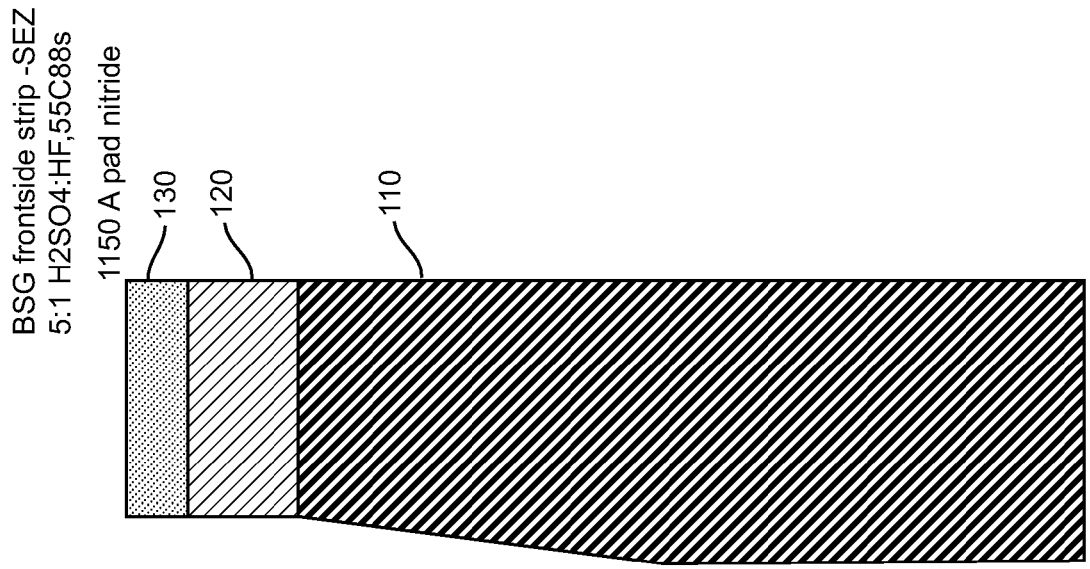
Figure 6:
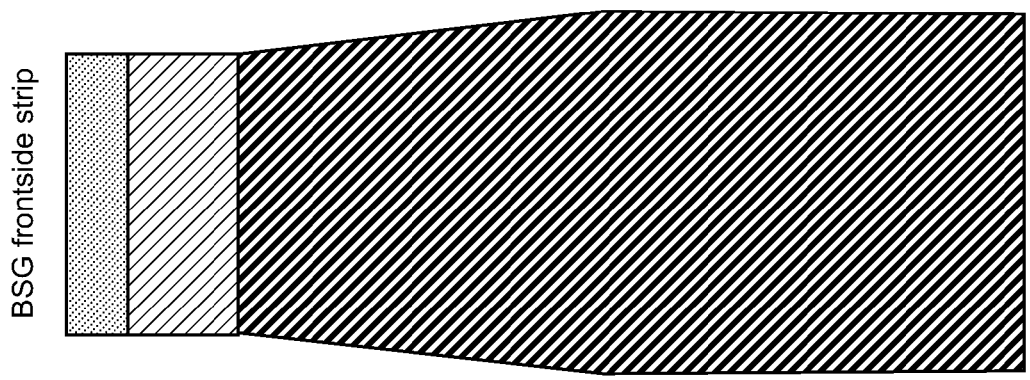
Figure 6:
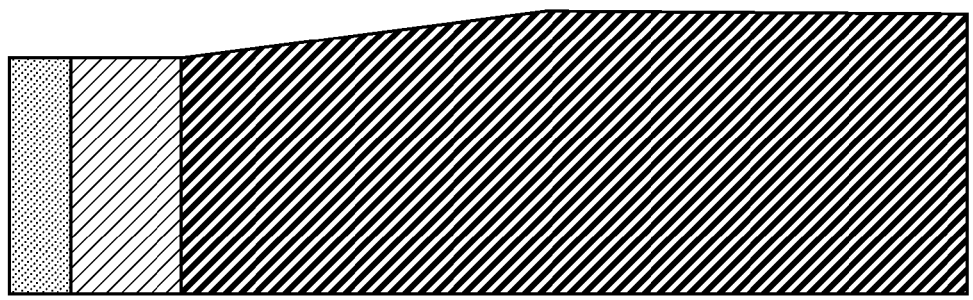
Figure 7:
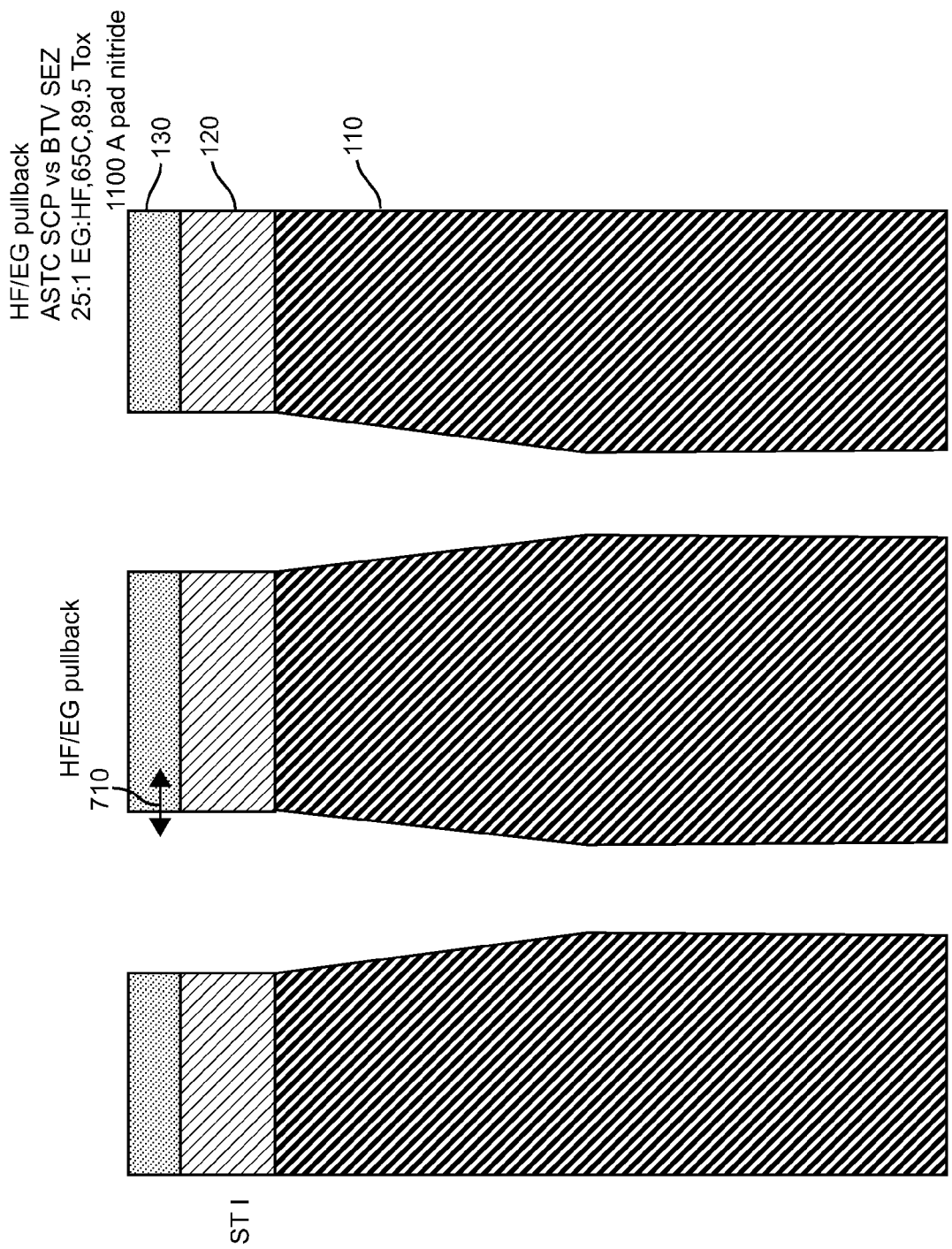
Figure 8:
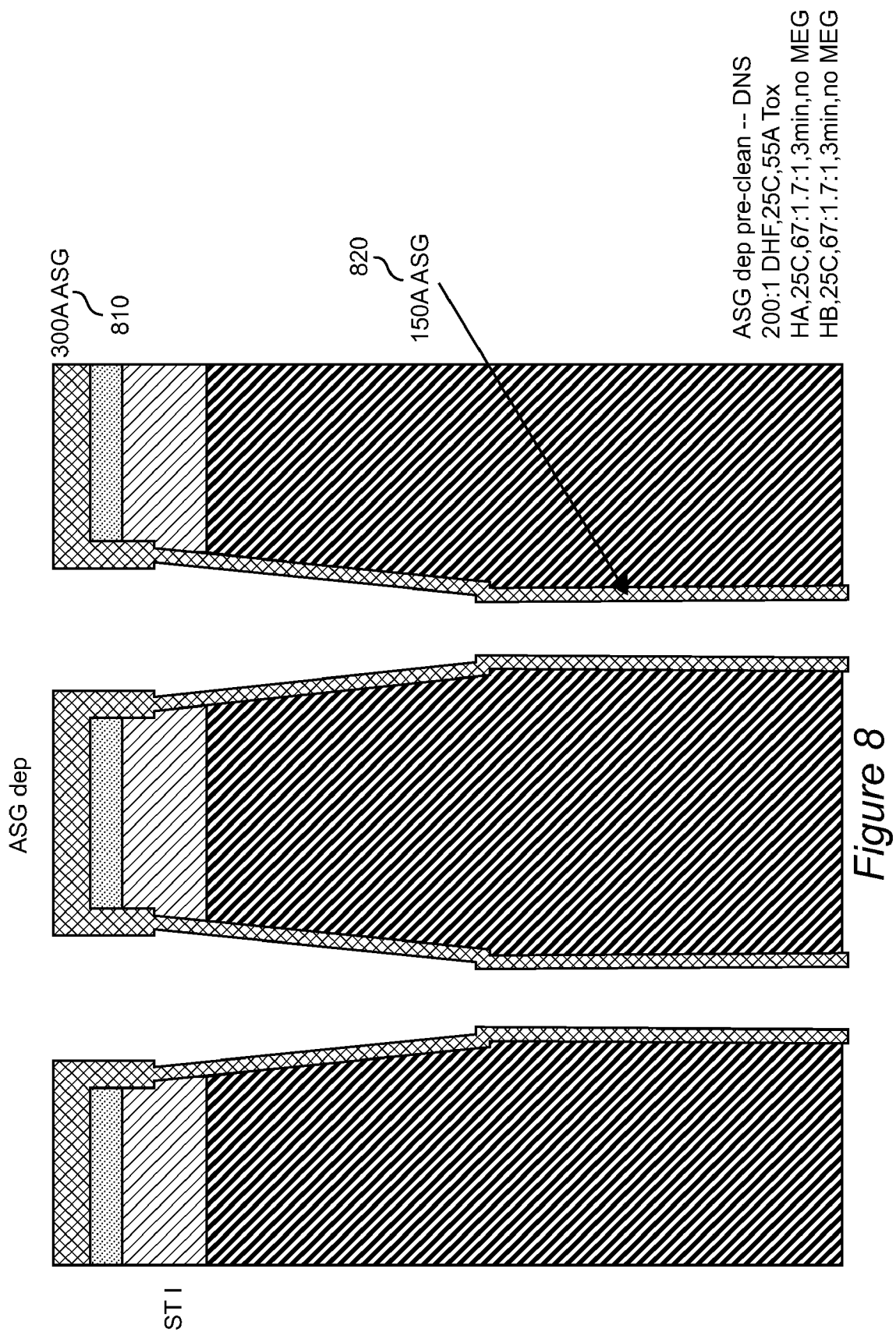
Figure 9:
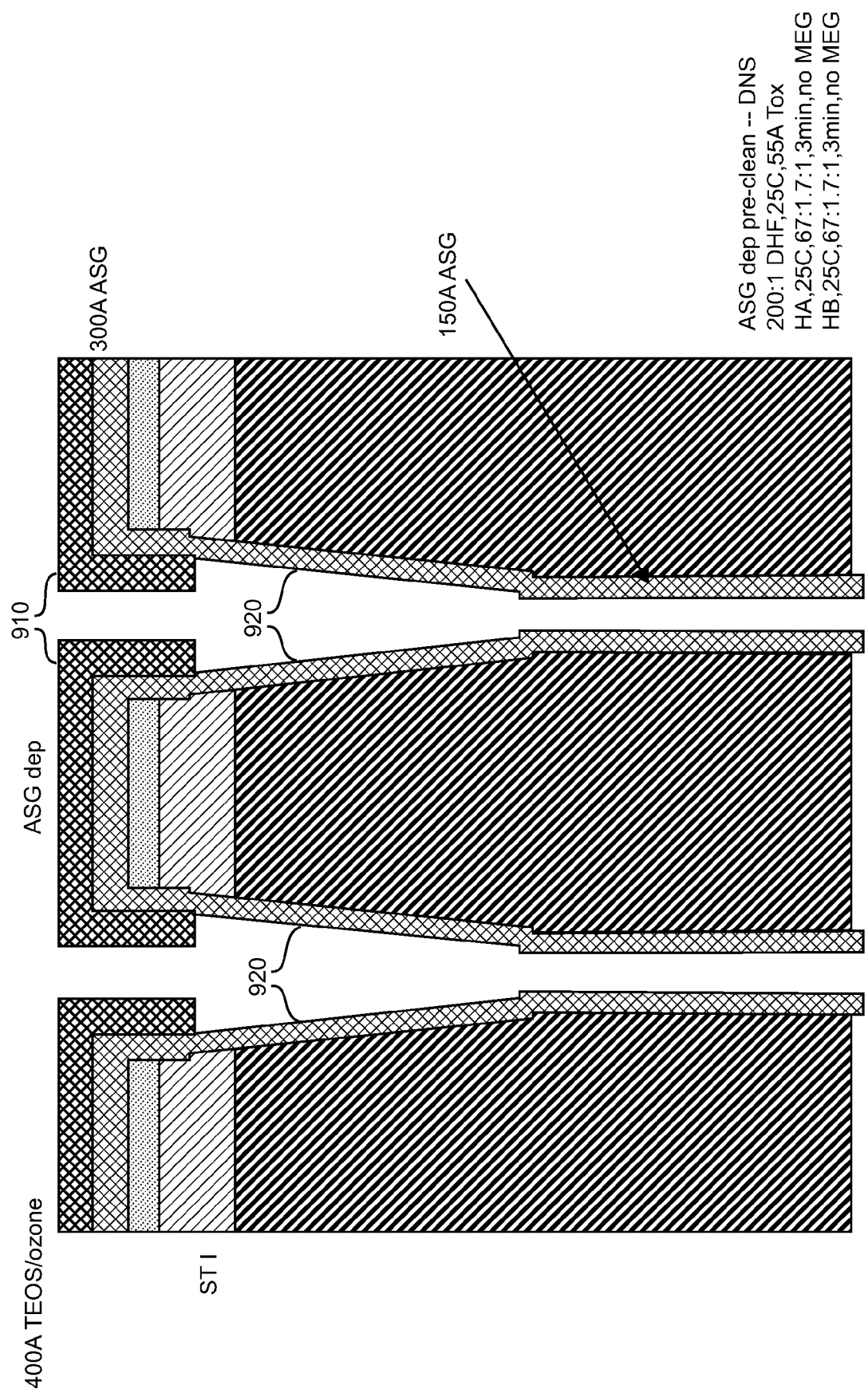

Following the trench etch, the remaining BSG hard mask is selectively stripped, leaving about 1150 Å of pad nitride 130 in place over the STI structures 120 as shown in FIG. 6. Then, as shown in FIG. 7 the sides of the STI structures 120 and the remaining pad nitride are etched using a mixture/combination of etchants such that the pad nitride and the material (generally oxide) of the STI structures are etched at approximately the same rate. This pull-back etching step is non-critical and, while the pull-back etch can serve to assure that the entire active area is opened, only a slight additional pullback of these edges surrounding the active area is desirable (as indicated by short double-ended arrow 710) to prevent the openings to the trenches from being excessively narrowed during subsequent deposition steps such as the deposition of arsenic-doped silicate glass (ASG) as shown in FIG. 8. The thickness of the ASG layer will typically be substantially thicker (810) at the openings where it is deposited on nitride than within the trench (820) where it is deposited on silicon or other semiconductor as illustrated in FIG. 8. A suitable thickness within the trench is about 150 Å and achieving that thickness will result in a thickness of about 300 Å at the trench opening. Therefore, the pullback illustrated in FIG. 7 need only compensate adequately for (a portion of) the thickness difference. The ASG is then covered with about 400 Å of TEOS 910 at the trench opening and a 200 Å TEOS layer within the trench as shown in FIG. 9. This layer of TEOS prevents arsenic dopant from out-diffusing during a subsequent drive-in step illustrated in FIG. 10.

Figure 10:
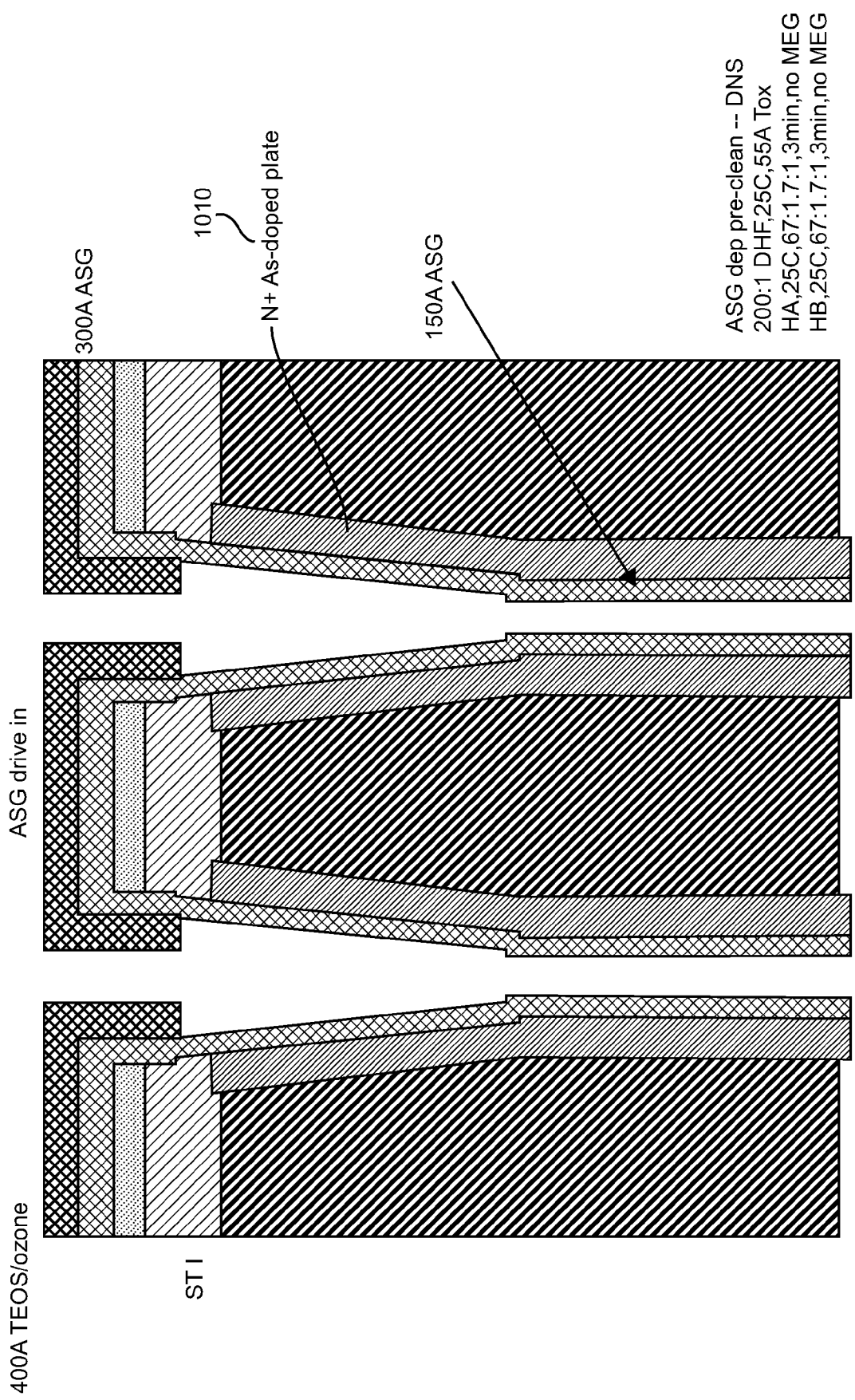
Figure 11:
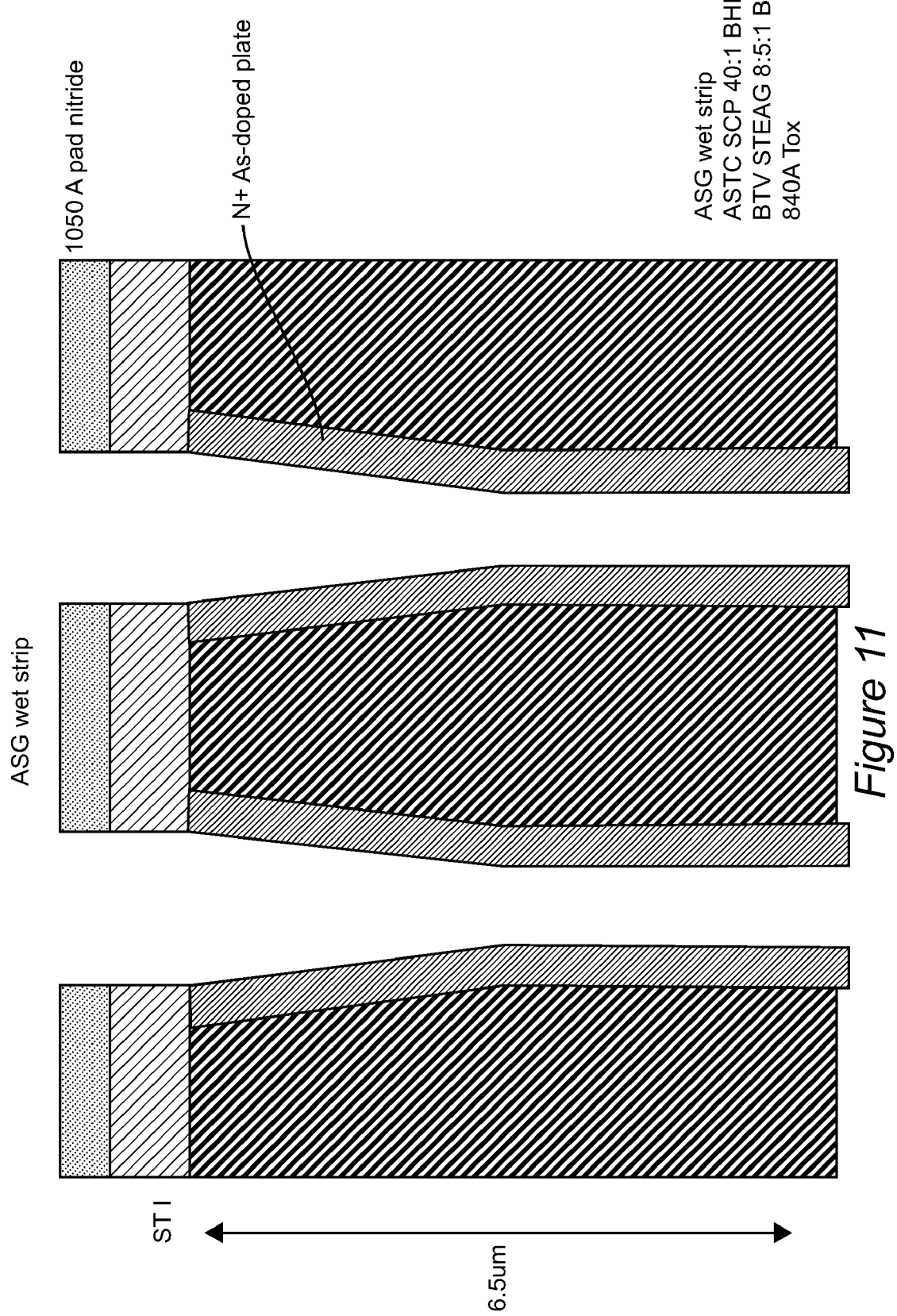

Specifically, as shown in FIG. 10, the arsenic is driven into the silicon chip 110 at the trench boundaries by heat treatment which causes diffusion of the arsenic from the ASG which serves as a diffusion source. The arsenic-doped silicon (or other semiconductor material) thus forms a capacitor plate 1010 extending under edges of the STI. The remaining TEOS/oxide and ASG is then stripped, preferably using a wet etch, as shown in FIG. 11. This etch reduces the thickness of the pad nitride 130 to about 1050 Å.

Figure 12:
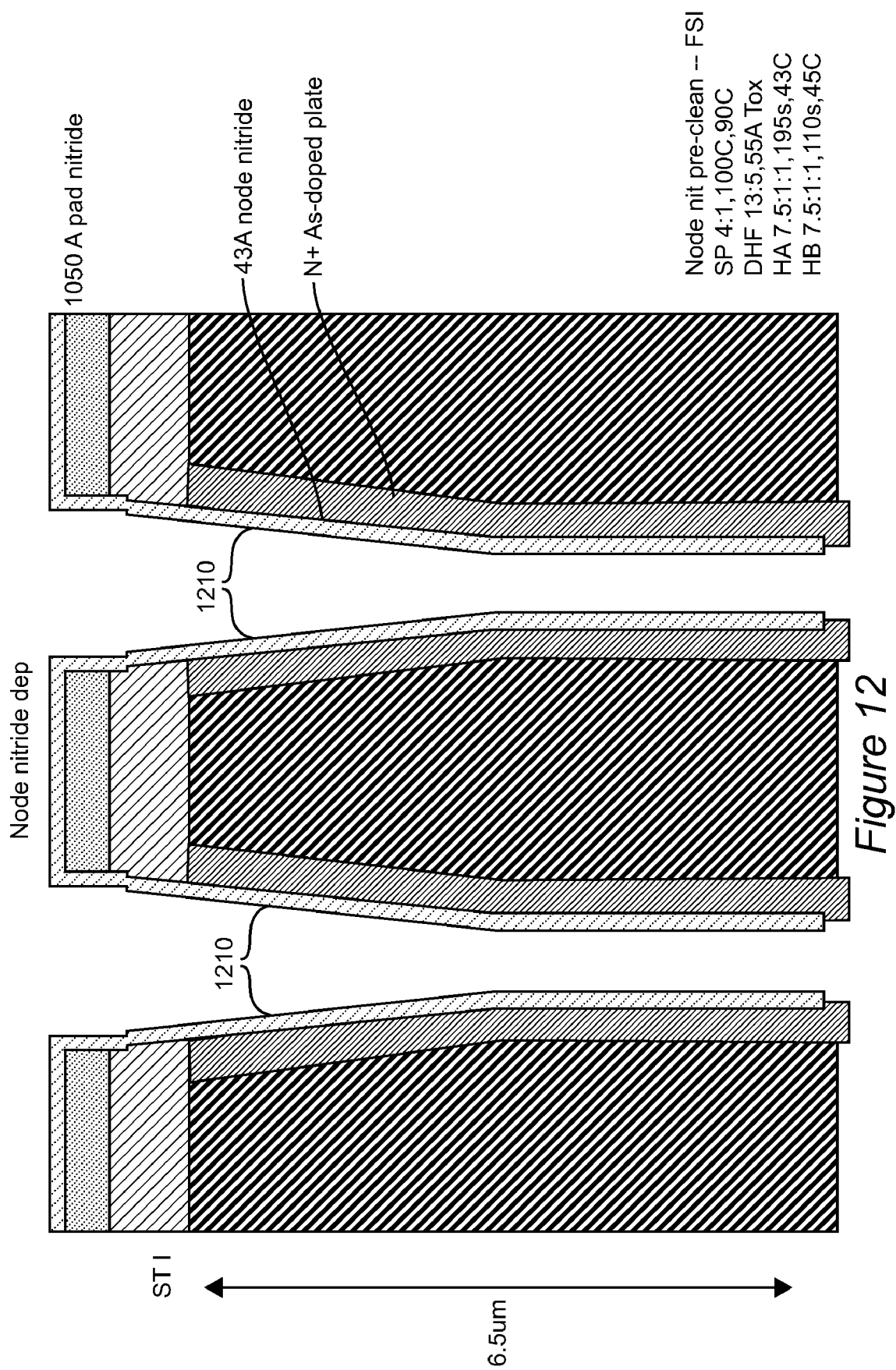
Figure 13:
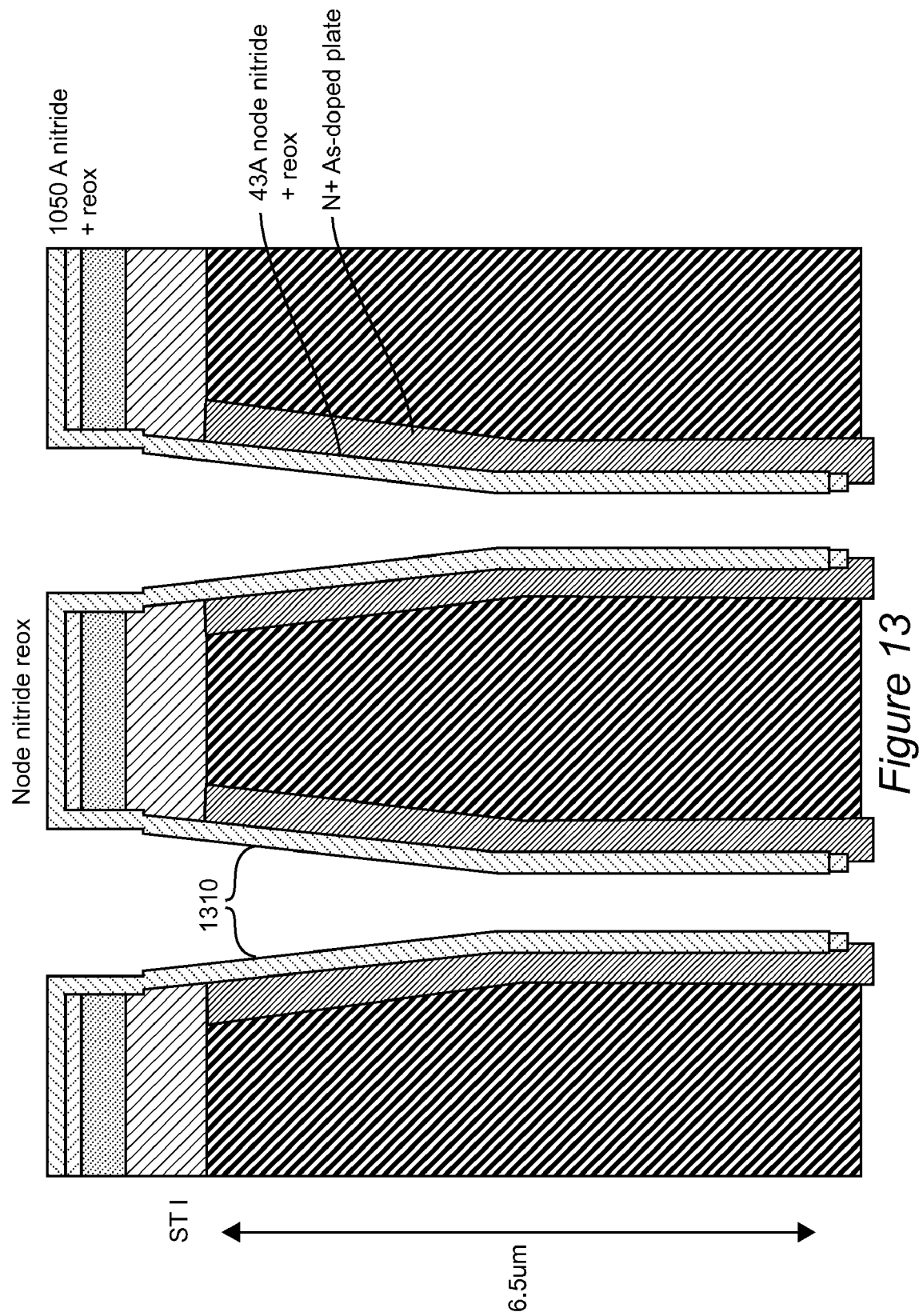
Figure 14:
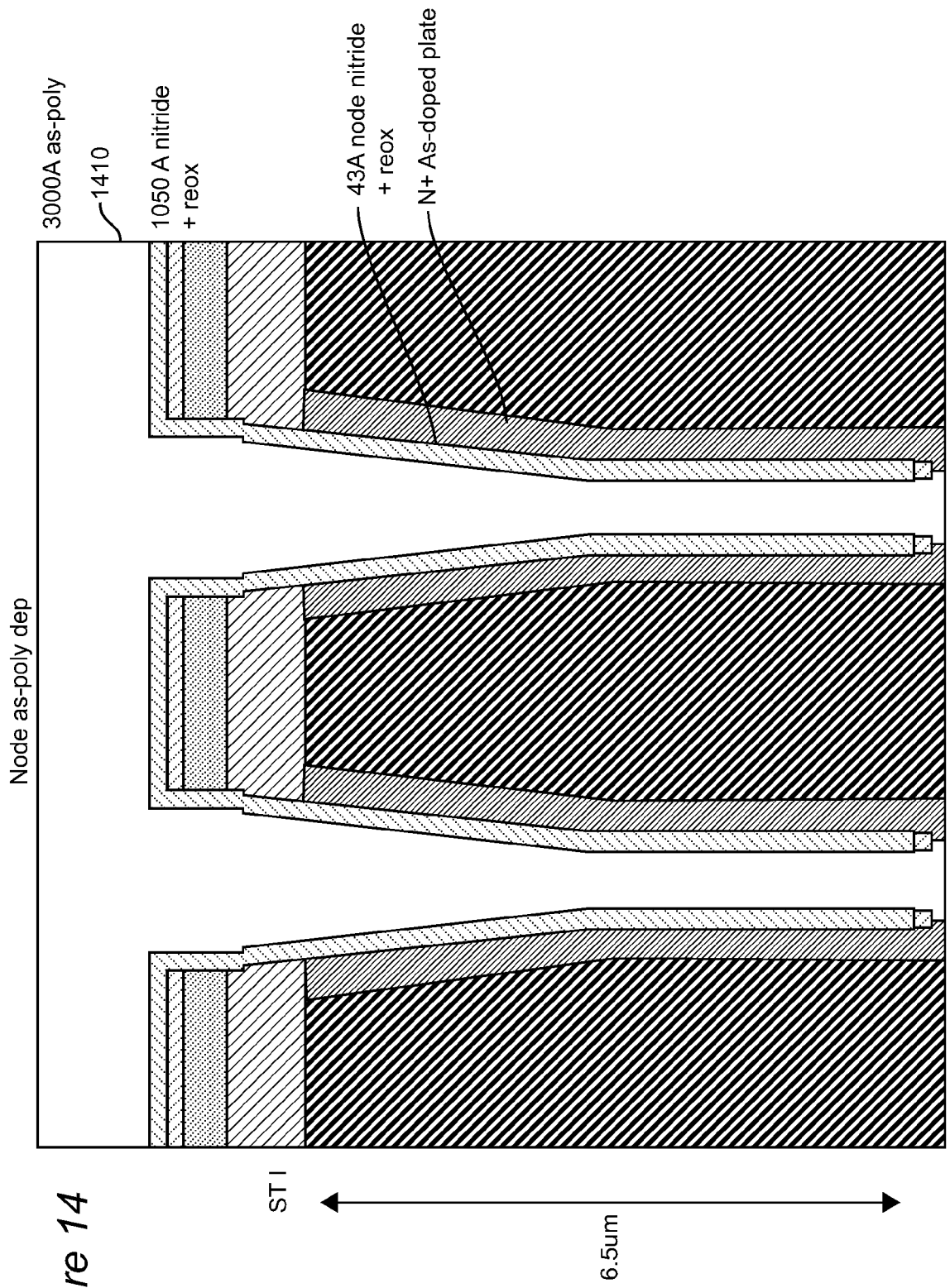
Figure 15:
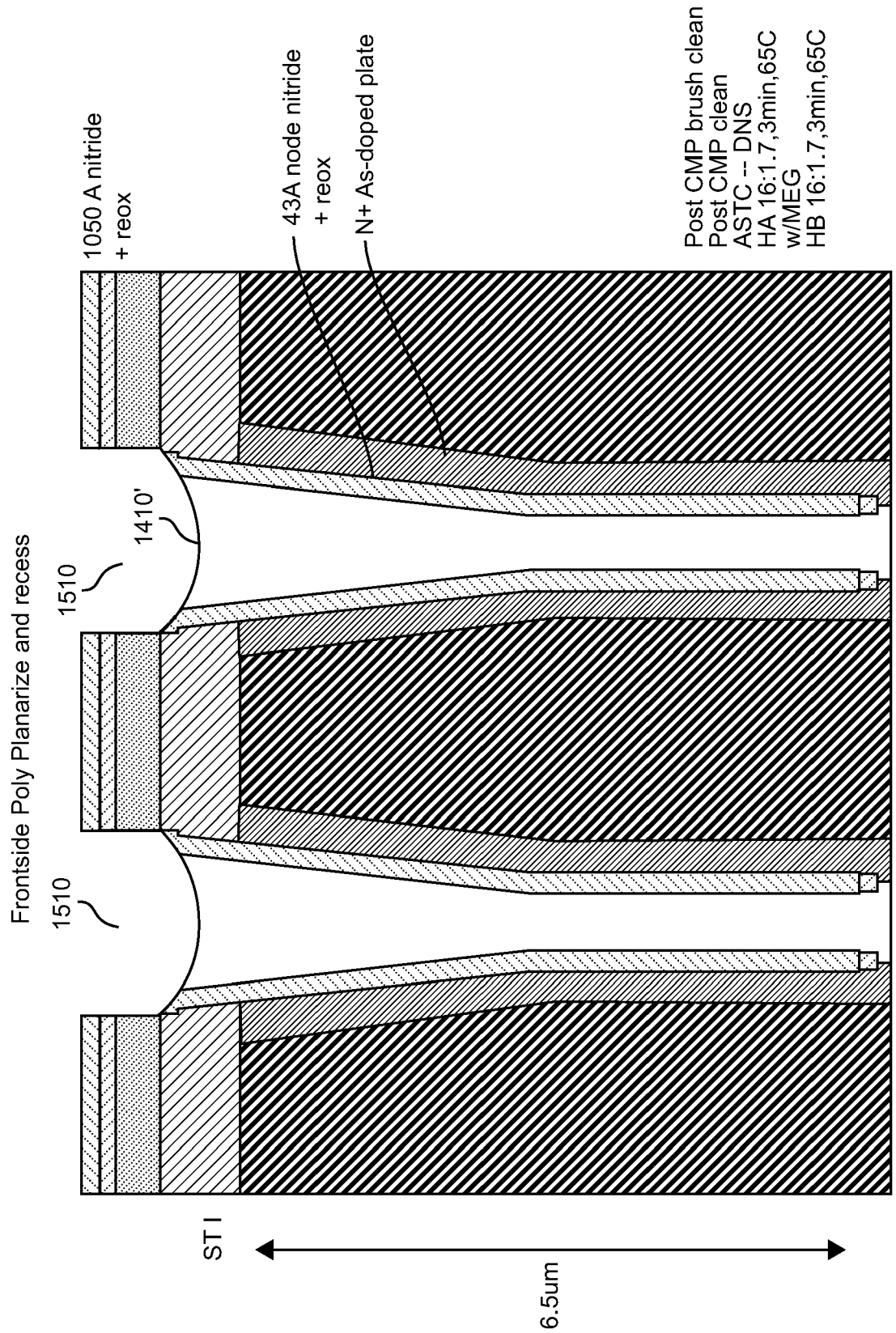
Figure 16:
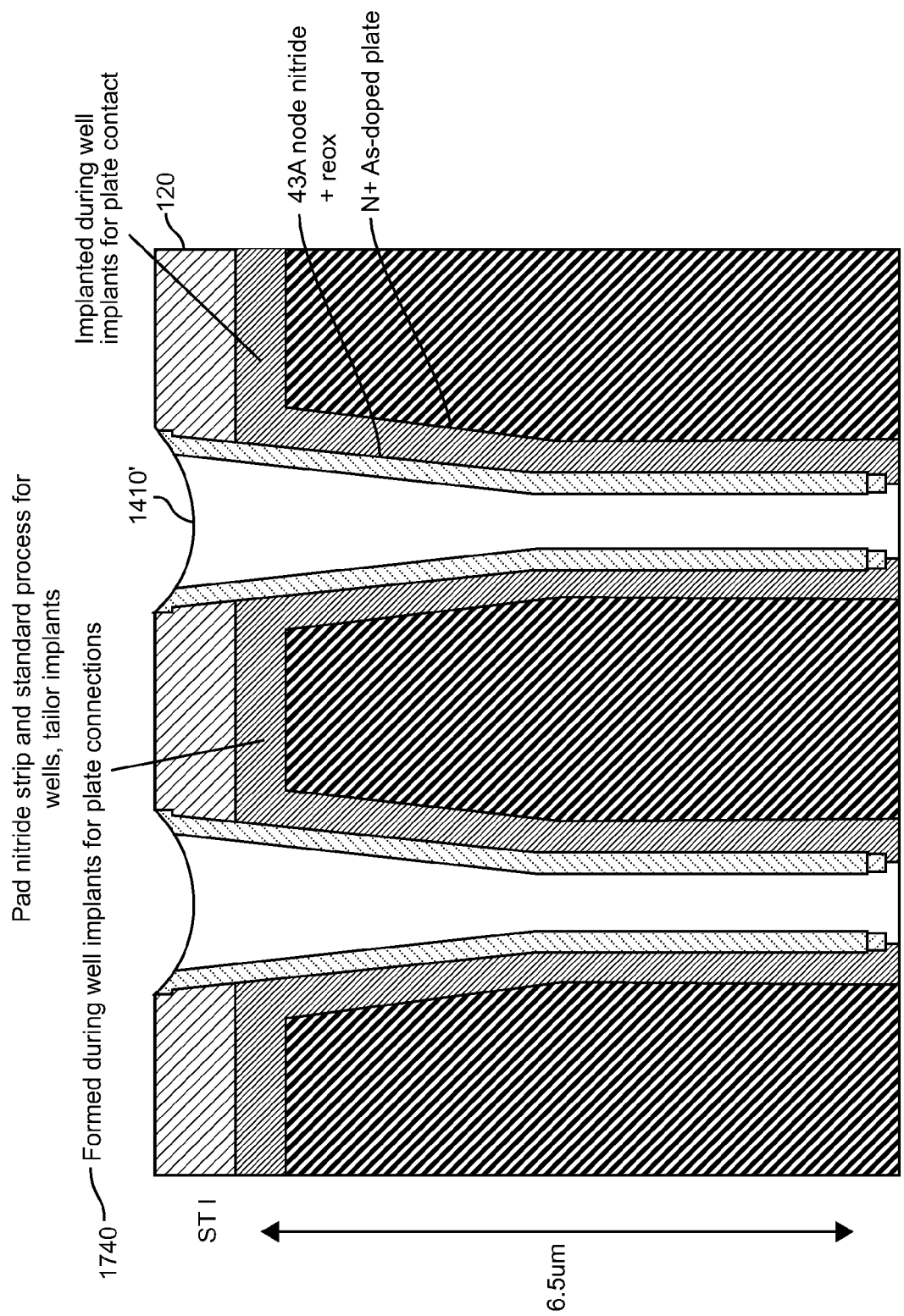

As shown in FIG. 12, a thin (e.g. about 43 Å) layer of nitride 1210 is deposited over the arsenic doped capacitor plate 1010, as shown in FIG. 12, followed by oxidation (1310) of the nitride as shown in FIG. 13. This forms the very thin capacitor node dielectric. The node electrode of the capacitor is then formed by a deposition of arsenic-doped polysilicon to fill the trenches as shown in FIG. 14 forming a layer 1410 over the entire device which is then planarized to the pad nitride 120 and contact openings 1510 formed by selective wet etch of the node polysilicon between isolation structures 120 as shown in FIG. 15 thus opening the entire area of the node 1410'. The pad nitride can then be stripped by selective etching as shown in FIG. 16. The capacitors in accordance with the invention are now substantially complete but for contact and wiring formation and other further processing for the integrated circuit can be performed by known techniques appropriate to the particular design.

In the interest of completeness, simple processes for contact formation are shown in FIGS. 17A and 17B. In the case of contacts, a nitride liner 1710 and a borophosphate silicate glass (BPSG) or other passivation material layer 1720 (which can be left in the completed device) are applied and patterned with openings corresponding to the trench capacitor nodes and etched to open the nodes. As noted above, the entire top of the node is preferably opened to provide a large contact area; providing both low resistance and large registration tolerance. The openings so formed can be filled with metal such as tungsten studs 1730 as shown in FIG. 17A. Silicidization can be performed or not, as desired. FIG. 17B illustrates formation of a similar stud 1730' at a location where a capacitor is not present in order to make a connection to the capacitor plate formed as discussed above in connection with FIG. 10. Connections 1740 within the substrate 110 may be made as desired with a patterned arsenic implant to capacitor plates 1010 as shown in FIG. 17A. Other techniques of making plate connections will also become apparent to those skilled in the art. The upper surface of the structure can then be planarized, if desired, and a layer of low-K dielectric is applied and patterned. A layer of metal such as copper is then applied and planarized by chemical-mechanical polishing (CMP) to make desired node connections to the capacitors. The connection 1750 illustrated in FIG. 17A illustrates a parallel connection of capacitors which may be desirable to obtain a desired capacitance value within a given geometry of chip area and layout and trench depth. The parallel node connections are thus preferably formed in the metal layer (which could be the first metal layer of the integrated circuit) while the desired plate connections are preferably formed within the semiconductor substrate 110 but could also be formed in a metal layer (including the first metal layer if layout permits).

The contact and wiring are formed following standard logic processing, some of which usually can be performed in common with trench decoupling capacitor formation described above. It is preferred to deposit and pattern a so-called middle-of-the-line dielectric 1720 to form openings corresponding to the nodes which are then filled with metal such as tungsten to form studs 1730. Connections 1730' to the capacitor plate are formed in a similar manner while connections between capacitor plates may be formed by patterned implants. Connections 1750 to and between nodes may be made using layers of metal such as copper.

In view of the foregoing, it is seen that the trench capacitor in accordance with the invention provides a large capacitance with a simple and inexpensive structure which can be formed without pattern density or process commonality constraints and, importantly, which allows a soft mask technique to be formed in preceding processes for defining active areas of the substrate and which is largely formed in a manner self aligned therewith. Only the mask opening process of FIG. 2 is not self-aligned and wide registration tolerance is provided for that process; the remainder of the process being self-aligned to the isolation structures which can be formed by a preferred soft mask process by virtue of the capacitor structure and formation method in accordance with the invention. Additionally, compared with the prior art, the area for the contact is larger by virtue of defining the active area with isolation structures prior to forming the trench capacitors. Further, in the prior art, the existence of a deep trench capacitor prior to shallow trench/recessed isolation structure formation makes the shallow trench formation very difficult and not compatible with standard and preferred processing to form logic structures.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of fabricating an integrated circuit including a decoupling capacitor, said method comprising steps of
   defining active areas of a chip,
   opening a mask at a location corresponding to at least one of said active areas,
   forming a trench at said at least one active area,
   forming a plate, a capacitor dielectric and a node in said trench, there being no collar structure around the dielectric and said plate being formed by dopant diffusion by heat treatment of a material deposited in said trench, and
   forming connections to said plate and said node.

2. A method as recited in claim 1 wherein said step of defining active areas comprises a step of
   forming isolation structures prior to said step of forming a trench.

3. A method as recited in claim 2 wherein said isolation structures are shallow trench isolation structures.

4. A method as recited in claim 2 wherein said isolation structures are recessed isolation structures.

5. A method as recited in claim 2 wherein said step of forming isolation structures is performed using a soft mask.

6. A method as recited in claim 1 wherein said opening step provides openings larger than said active areas and overlaps a portion of an isolation structure.

7. A method as recited in claim 1 further including a step of pull-back etching of sides of a pad nitride layer formed between said active areas.

8. A method as recited in claim 1 wherein said material is arsenic doped silicate glass.

9. A method as recited in claim 1 wherein said step of forming a trench provides a tapered trench coextensive with an active area.

* * * * *